United States Patent [19]

Jewett

[11] Patent Number: 4,659,421
[45] Date of Patent: Apr. 21, 1987

[54] SYSTEM FOR GROWTH OF SINGLE CRYSTAL MATERIALS WITH EXTREME UNIFORMITY IN THEIR STRUCTURAL AND ELECTRICAL PROPERTIES

[75] Inventor: David N. Jewett, Harvard, Mass.

[73] Assignee: Energy Materials Corporation, So. Lancaster, Mass.

[21] Appl. No.: 723,942

[22] Filed: Apr. 16, 1985

Related U.S. Application Data

[63] Continuation-in-part of Ser. No. 307,748, Oct. 2, 1981, abandoned.

[51] Int. Cl.$^4$ .............. C30B 13/10; C30B 15/02; C30B 27/02
[52] U.S. Cl. .............. 156/617 SP; 156/605; 156/608; 156/DIG. 64; 156/DIG. 89; 156/DIG. 67; 422/249
[58] Field of Search .............. 156/605, 608, 617 SP, 156/DIG. 89, 617 H; 422/249, 246

[56] References Cited

U.S. PATENT DOCUMENTS

| | | | |
|---|---|---|---|
| 2,727,839 | 12/1955 | Sparks | 156/617 SP |
| 2,892,739 | 6/1959 | Rusler | 156/617 SP |
| 2,977,258 | 3/1961 | Dunkle | 156/608 |
| 3,249,404 | 5/1966 | Bennett | 156/608 |
| 3,464,812 | 9/1969 | Utech et al. | 75/65 |
| 3,498,847 | 3/1970 | Keller | 422/249 |
| 3,505,025 | 4/1970 | Dessauer | 422/249 |
| 3,511,610 | 5/1970 | Dohmen | 422/249 |
| 3,627,499 | 12/1971 | Duc et al. | 156/617 SP |
| 4,036,595 | 7/1977 | Lorenzini et al. | 156/617 SP |
| 4,207,293 | 6/1980 | Scholl et al. | 156/617 SP |
| 4,224,100 | 9/1980 | Hartzell | 156/617 M |
| 4,282,184 | 8/1981 | Fiegl et al. | 422/249 |
| 4,289,571 | 9/1981 | Jewett | 156/617 H |
| 4,330,359 | 5/1982 | Lovelace | 156/608 |
| 4,330,362 | 5/1980 | Zulchner | 422/249 |
| 4,410,494 | 10/1983 | Fiegl | 422/106 |

FOREIGN PATENT DOCUMENTS

| 246287 | 8/1963 | Australia . |
|---|---|---|
| 3003717 | 6/1981 | Fed. Rep. of Germany . |
| 1154733 | 3/1982 | Japan . |
| 2067920 | 8/1981 | United Kingdom . |

OTHER PUBLICATIONS

Crystals 8, Springer-Verlag 1982 Zulehner pp. 1-143.

Primary Examiner—Gary P. Straub
Attorney, Agent, or Firm—Kenway & Jenney

[57] ABSTRACT

A system and process for growing extremely high quality single crystal materials, particularly silicon and other semiconductor materials, containing a generally uniform distribution of dopants, impurities, and oxygen, both axially and radially, wherein the concentration of impurities and oxygen and the number of defects are minimized. A significant feature is the use of a shallow tray-like crucible consisting of a replenishment zone and at least one crystal growth zone independently heated by one or more heating elements through the bottom of the crucible. In the preferred embodiment, an oval shaped crucible is used which consists of one replenishment zone and one growth zone. In one embodiment, a spiral shaped heater is centered underneath the feed rod and growing crystal and a "picture frame" shaped heater is located underneath the outer edges of the replenishment and growth zones to provide a more controlled thermal gradient. Mechanical pumping produces a controlled, directed, three-dimensional flow within the melt from the replenishment zone to the growth zone. The pumping is achieved either by rotation of a solid feed rod in the replenishment zone or by a strong directed flow of an inert gas onto the surface of the melt. Guide elements positioned within the crucible assist in directing the pumped flow from the replenishment zone to the growth zone so that the flow sweeps through the growth zone under the crystal to produce a thin boundary layer at the growing crystal surface, uniformly mixes in the dopant, and removes any impurity build up in the growth zone. Optionally, magnets to increase apparent melt viscosity and improve flow control and separate dopant addition mechanisms may be utilized.

18 Claims, 4 Drawing Figures

SYSTEM FOR GROWTH OF SINGLE CRYSTAL MATERIALS WITH EXTREME UNIFORMITY IN THEIR STRUCTURAL AND ELECTRICAL PROPERTIES

REFERENCE TO RELATED APPLICATION

This application is a continuation-in-part of U.S. Ser. No. 307,748, filed Oct. 2, 1981, now abandoned.

BACKGROUND OF THE INVENTION

The invention relates generally to a system for producing a single crystal material in which impurities, dopants, and oxygen are well controlled and substantially uniformly distributed, both axially and radially.

Semiconductor materials are used extensively in the electronics industry for the fabrication of devices such as integrated circuits, diodes, transistors and photovoltaic cells.

While semiconductor materials such as gallium arsenide are important for many applications, particularly as substrates for exceptionally fast devices useful in many military applications, presently, silicon is the most widely used semiconductor material. In particular, silicon is used as the substrate for most integrated circuit devices.

One well known characteristic of these materials is the sensitivity of their electrical properties to factors such as impurities and crystal defects. For example, the addition of less than 0.01 weight percent of a particular type of impurity can increase the electrical conductivity of a typical semiconductor like silicon or germanium by six or seven orders of magnitude. In any material, there will be some percentage of impurities that are present in the source material or which enter the material during its manufacture and subsequent processing, such as oxygen. In addition to impurities that are present in the source material or result from the manufacturing process, it is often desirable to dope a semiconductor material by selectively introducing impurities that are incorporated into the crystalline structure. This incorporation is a function of the segregation coefficient which is unique to that particular element.

As is well known, boules of silicon are typically grown using the Czochralski process by withdrawing a seed crystal from a crucible of molten silicon. The boule is sliced horizontally to form thin circular "wafers", which are then overlaid with silicon dioxide or other insulating materials, metal conductors, and other semiconductor materials. Typically, the wafers have a diameter of up to about four inches and are divided into a number of individual integrated circuits.

Because the operation of a semiconductor device depends on the electrical properties of the material forming the device, it is highly desirable to use silicon that has a well controlled, uniform concentration of oxygen and dopants. Minimizing variations in quantity and distribution of impurities is even more crucial in the production of very large scale integrated circuits (VLSI's) or to fabricate one large circuit, such as an entire computer, on a single wafer to reduce the length of connections and increase the overall speed of operation of the computer.

At the outset, it is important to note that liquid silicon is a difficult material to handle. It is liquid only at extremely high temperatures, in excess of 1400° C., it is opaque, and it has unusual surface tension and wetting properties which cause it to behave more like mercury than water. In addition, a growing single crystal can readily be contaminated by carbon and other elements or become polycrystalline due to contaminants or changes in parameters at the growth zone such as the temperature profile.

Conventional CZ processes

The Czochralski (CZ) process for growing a single silicon crystal, or variations of this process, is the most common method used to produce single crystal materials. Solid silicon feed material and the desired dopant are put into a deep, cauldron-like crucible of fused silica. The crucible is supported in a vacuum or inert gas furnace and heated until the silicon is all melted. The temperature is then decreased to just above the melting point, and a single crystal seed is inserted in the melt. The seed and the crucible are rotated in opposite directions at about 30 rpm each. By controlling the crucible temperature and the seed pull rate, the crystal is seeded, shouldered, and a boule with the desired diameter pulled until the liquid silicon is nearly exhausted. The crystal is then tailed and withdrawn from the crucible.

Typically, the system is shut off and cooled for a number of hours after which it is supplied with a new crucible, charge, and dopant, and reheated. This usually takes at least one-half a working shift. In newer systems, the crucible may be replenished with chunk or rod feed between crystals. However, the replenishment process in these systems requires a substantial amount of time, there is considerable crucible deterioration, and impurity build-up in the crucible is usually a significant problem. These problems make this practice less advantageous and each crucible is therefore not usually replenished more than once.

As will be discussed below in more detail, the rotation of the boule and crucible introduces many problems that adversely affect the quality of the crystal being grown. However, rotation has proven to be necessary in the conventional CZ process to increase the uniformity of the melt, reduce the thickness of the boundary layer at the growth interface, establish a more uniform cylindrical thermal geometry, and facilitate the transport of heat from the crucible walls.

In the conventional CZ process, the thermal gradient at the growth interface is stabilized to some degree by slowly raising the crucible so that during the entire crystal growth pull the solid/liquid interface remains in about the same position with respect to a furnace heating element that surrounds the side of the crucible. As the crystal forms, the melt level drops and the walls of the crucible and its support block an increasing amount of the radiation from the interface area. This complicates the maintenance of a stable thermal gradient in the growth zone. Also, the pull rate must be reduced in order to maintain a constant boule diameter.

Dopant Concentration in Conventional CZ Processes

Another significant problem with the conventional CZ process is dopant control. The dopant, in the form of pellets of a master alloy, is placed in the crucible with the feed silicon. After the silicon is melted and the crystal growth begun, the dopant concentration begins to increase in the melt due to impurity rejection at the solid/liquid growth interface. Each dopant or impurity has a characteristic segregation coefficient which relates to the comparative ease with which the foreign atom can be accomodated into the silicon crystal lattice.

Since no other metal atom fits into the silicon lattice as well as silicon, all dopants are incorporated into the crystal at less than their proportional concentration in the melt.

As the dopant concentration increases in the crucible, the dopant concentration in the crystal also increases, with the result that the quantity and distribution of dopant varies. substantially from one end to the other of a standard CZ crystal. This results in a corresponding variation in resistivity and the present, very wide range of resistivity specifications for CZ silicon wafers.

Oxygen Concentration in Conventional CZ Processes

A related problem to dopant control is the control of the level of oxygen throughout the single crystal boule. The amount of oxygen present in the silicon crystal is a function of the ratio of melt-wetted crucible wall area to melt gas interface. In the conventional process, this ratio begins as high as 3–5:1 when the crucible is fully charged, and falls to a ratio of typically 1.2:1 as the melt level falls during crystal growth. As the fused silica ($SiO_2$) crucible is partially dissolved into the molten silicon, oxygen is placed in solution in the melt and evolved from the surface of the melt as SiO gas. The total rate of silica dissolution is a function of temperature, stirring rate, and surface area, and to a much less extent, the prevailing concentrations of gases in the liquid silicon. Therefore, as the melt level drops when the silicon crystal is withdrawn, the ratio of silicon-wetted crucible area to silicon-gas surface area decreases and the oxygen level decreases. While it is possible to keep the oxygen level relatively uniform at higher concentrations of oxygen by increasing the crucible rotation rate, this technique does not work well during the entire growth of a boule in conventional CZ growth where the melt level falls continuously during the growth and there is simply less melt to "wash" the silica crucible to generate SiO and oxygen. And it is important for many applications to use silicon where the oxygen concentration is not only uniform, but also has a low preselected value, preferably an average of 5–15 ppm oxygen.

Swirls and Other Radial Non-Uniformities in Oxygen and Dopant Concentrations

Another problem with the standard CZ process is radial variation in resistivity and impurities within a given boule or wafer. These defects are generated by the required rotation of the crucible and the counterrotation of the boule. One effect of this rotation is that it produces a set of convection cells in the liquid silicon melt. Although the precise shape, size and flow rates of these cells are not well understood, and there is not even a good theoretical model, it is clear that these cells exist. Each cell may cause variations within the cell in temperature, dopant, oxygen, and impurity concentration. These variations influence impurity incorporation, melt-back and regrowth of the crystals. The resulting radial non-uniformity of growth conditions causes defects in a swirl pattern. The greater the depth of the melt in the CZ process and the degree it changes during crystal growth, the greater the lack of uniformity.

Heat Control and Resulting Thermal Gradients

Lack of heat control is another problem with the conventional CZ process, both with respect to uniformity and to total required heat. One aspect of this problem is that the temperature of the crucible must be maintained at approximately 50° to 100° C. above the melting point of the silicon to insure that the silicon remains completely melted. This high temperature of the melt and the crucible increases the deterioration of the crucible.

Another aspect is that heating is from the crucible exterior, requiring large heaters capable of maintaining a large crucible and a full charge of melt at temperatures in excess of 1400° C. This requires a large power supply with attendant high energy costs and is inefficient in that there are significant thermal barriers between the heater and the melt at the growth zone. Further, it is substantially impossible to provide any fine control over the magnitude or shape of the thermal gradients within the melt at the growth zone. As noted above, the presence of convection cells and the general turbulence created by the counterrotations of the crucible and the boule also introduce unpredictable local variations in the three-dimensional temperature profile within the melt, and particularly at the growth interface.

Another factor, as previously discussed, is that the crucible in the conventional CZ process must be slowly raised so that the solid-liquid interface remains in about the same position with respect to the furnace heating element during the entire crystal growth pull. The resulting axial variations in the heat radiated to the boule from the non-wetted walls of the crucible and in the heat transported by convection within the melt cause variations in the thermal environment of the crystal both at the growth zone and above the growth zone in the solid crystal boule.

Carbon Contamination

Yet another problem with the conventional CZ process is the presence of carbon in the apparatus used for growth which can form CO gas, or enter the melt as elemental carbon. Sources of carbon in the melt are the feed material, the graphite heating element, the insulation pack and the crucible holder. Carbon monoxide gas can form by reaction of silicon monoxide gas or solid silicon dioxide with hot graphite parts. If the level of carhon increases above 45 ppm in the melted silicon feed, small SiC crystals will form in the melt, usually causing the crystal to become polycrystalline. At lower levels, carbon incorporated in the silicon crystal lattice degrades the electrical performance of silicon wafers used in semiconductor device fabrication.

In the conventional CZ system, a forced argon flow sweeps down along the crystal and over the melt and is then withdrawn from below the hot zone. This flow path is away from the crystal towards the graphite parts, thereby forming a barrier to the transport of carbon monoxide, formed from the reaction of the hot graphite parts with SiO, back to the melt. The inert gas flow is also useful to remove SiO gas that can condense on the cooler parts of the crystal and apparatus to form a loose, powder deposit.

As discussed above, the factors of temperature and temperature profile, heat radiation and control, quality of melt material, ratio of melted material-wetted crucible area to melted material-gas interface, rate of rotation of the crucible, rate of rotation of the growing crystal, diameter of the growing crystal, rate of withdrawal of the growing crystal, composition of the crucible, variation in dopant concentration due to segregation at the crystal-melt interface, and deterioration of the melt material over time due to crucible degradation and impurity buildup are all significant and interrelated.

In conventional CZ growth of silicon boules, variations in the thermal gradients, pull rate, rotation rates, and impurity, dopant, and oxygen concentrations produce a single crystal boule in which no two wafers, or even substantial areas of a single wafer, are alike in important ways. The main problems are a lack of uniformity of dopant and oxygen concentration, both radially and axially, and the control of impurities such as carbon and transition metals within the single crystals. These problems produce corresponding variations through the crystal in important electrical properties such as resistivity. Wide variation in the oxygen and dopant concentrations along the axis of the boule is characteristic of the CZ process. The oxygen concentration begins at a high level and steadily decreases as the crystal grows. The dopant concentration also varies axially, but in the opposite direction. Device manufacturers therefore can obtain only a small portion of wafers from a given boule that have any preselected range of oxygen or dopant concentration. This has obvious and serious consequences for production economics. For silicon, yield ratios of 40 to 60% are common. For gallium arsenide of a suitable quality for advanced military applications, current yields are much lower. It is also significant that current CZ processes produce boules of decreasing radial uniformity as diameters increase above four inches.

These factors influencing the growth of single crystals and their strong interrelationship have made overcoming the problems of the standard CZ process very difficult. U.S. Pat. No. 4,410,494 to Fiegl describes one attempt to deal with the drawbacks inherent in single batch processing of the conventional CZ technique, particularly those introduced by a changing melt throughout the growth process. Fiegl uses a replenishment crucible in which silicon feed material is melted down and then fed into separate crystal growth crucibles. However, the transfer of molten silicon while maintaining its purity is a difficult problem. Fiegl proposes transport by quartz siphon tubes. While the concept appears to be simple, there are practical problems. The rate of flow of the material must be closely controlled to prevent melt surges, the level of melted silicon in the crucibles must be closely controlled, and surface extensive heaters and insulating shells are necessary along the siphon tubes to prevent the silicon from solidifying in the siphon tube. Due to the multiple crucibles, siphon tubes, multiple level measuring devices, and heating elements, the cost of building and operating the apparatus described by the '494 patent is high. The siphon tubes are also, despite precautions, greatly susceptible to malfunction due, for example, to blockage by solidified silicon or sag due to overheating.

It is therefore a principal object of the present invention to provide a system for growing single crystal materials, particularly silicon, gallium arsenide, and other semiconductor materials, containing a generally uniform distribution of dopants, impurities, and oxygen, both axially and radially.

Another object of the present invention is to provide a system which allows the independent control of crystal growth parameters such as temperature, growth rate, oxygen concentration and dopant concentration.

A further object of the present invention is to provide a system for producing extremely high quality single crystal materials relatively free from swirl and dislocation defects and containing a preselected and well-controlled level of dopants and oxygen, including low oxygen concentration levels of less than 20 ppm.

Yet another object of the present invention is to provide a system for growing single crystals of semiconductor material with the foregoing advantages that allows substantially continuous production of high quality single crystals.

A still further object is to provide a system with the foregoing advantages that has substantially reduced energy requirements as compared to conventional CZ crystal growth techniques and has dramatically increased yields when the crystal is used in the fabrication of electronic semiconductor devices.

Another object of this invention is to provide a system with the foregoing advantages that also allows the growth of single crytals with diameters well in excess of four inches while retaining an extremely high degree of uniformity in crystal structure and dopant and oxygen concentrations radially and axially throughout the crystal.

SUMMARY OF THE INVENTION

A process and system for growing extremely high quality single crystal materials particularly silicon, containing a generally uniform distribution of elements and a minimum of impurities and oxygen, both axially and radially.

The process comprises the following steps. One, melting the feed material, either a solid rod, chunks or powder, under a vacuum or in an inert gas atmosphere in a shallow crucible divided into a replenishment zone and at least one crystal growth zone wherein the replenishment and growth zones are independently heated, either by single heaters with a generally rectangular shape located underneath the individual zones, or by multiple heaters located underneath the individual zones. In one embodiment, a spiral shaped heater is centered under the solid material and a "picture frame" shaped heater is located underneath the outer edges of the replenishment or growth zone. The heating is controlled to heat the feed material to just above the melting temperature.

Two, mechanically pumping the melted material from the replenishment zone to the growth zone in a controlled, directed, three-dimensional flow. In one embodiment, pumping is by rotating a solid feed rod which contacts the melt in the replenishment zone just below the surface. In a second embodiment, the controlled, directed flow is achieved by injecting an inert gas, preferably argon, onto the surface of the melted feed material in the replenishment zone.

Three, guiding the controlled, directed flow into the growth zone to produce a thin boundary layer at the growing crystal surface, uniformly distribute dopant, and remove any impurity build up in the growth zone. Guiding is generally through the use of guide elements specifically dimensioned and positioned within the crucible and around the growth and replenishment zones. In one embodiment, a C-shaped collar with tapered edges at the opening is placed around the growth zone, wherein the opening is adjacent the crucible wall opposite the replenishment zone. In a different embodiment, guide elements which are generally concentric to the feed rod or growing crystal and have subsurface openings may be utilized in both the growth and replenishment zones. In another embodiment, a concentric element may be positioned around the growing crystal which has a bottom surface extending inward toward the crystal so that incoming melt material must enter the growth zone underneath the crystal. Baffles may be positioned in the crucible between the growth and replenishment zones.

Fourth, seeding, shouldering and pulling a single crystal from the growth zone.

Optionally, the feed material may be preheated immediately before it is melted in the replenishment zone. Dopants may be added, either by "painting" a dopant strip onto the feed rod or by a separate mechanism which feeds in solid/dopant rod or chunks at a controlled rate. Apparent viscosity of the melt may be increased by positioning magnets on top of the insulation pack under the heating elements. An inert gas can also be directed through the furnace to help control thermal gradients and prevent contamination of the melt with carbon from the insulation pack. Radiation shields may be positioned over and adjacent the growth zone to further control and maintain the thermal gradient in the growth zone.

The various steps of the process: heating, pumping, and guiding, as well as the elements of the system: the shallow crucible, independent heating elements, mechanical pumping means, guide elements, and optional magnets, pre-heaters, gas flows, and radiation shields are all balanced to produce single crystal material with an extremely uniform dopant and minimal oxygen and impurity content, both axially and radially, which has particular application in the electronics industry due to the uniform, controlled electrical properties of the material.

DETAILED DESCRIPTION OF THE INVENTION

With reference to FIGS. 1-4, in the system according to the present invention, a generally cylindrical boule of a single crystal 16 of silicon is grown vertically from a melt 28 of liquid silicon held in a shallow crucible 10. As silicon is solidifed from the melt to form the boule 16, the melt level is maintained at a generally constant level by melting in a solid polycrystalline silicon rod 12. The use of a shallow tray-like crucible as contrasted to the deep, cauldron-like crucible of conventional CZ techniques, is a significant feature of the present invention which has not heretofore been used for the growth of boules grown vertically from a melt. The crucible 10 is formed of fused silica ($SiO_2$). The melt preferably has a depth of at least 0.2 cm, but less than 2.5 cm throughout the crucible 10. In one form of the present invention, a solid rod 14 of a dopant material is also melted into the crucible 10, although the rate of addition of the dopant may be different from that of the replenishment rod 12, so that the level of dopant concentration within the melt held in the crucible remains generally constant. In another form, dopant may be added by painting onto the polycrystalline feed rod 12 a strip of a solution containing the element to be added to the as grown crystal. For example, boric or phosphoric acids can be "painted" on to add boron or phosphorous as a dopant.

Figure 1:
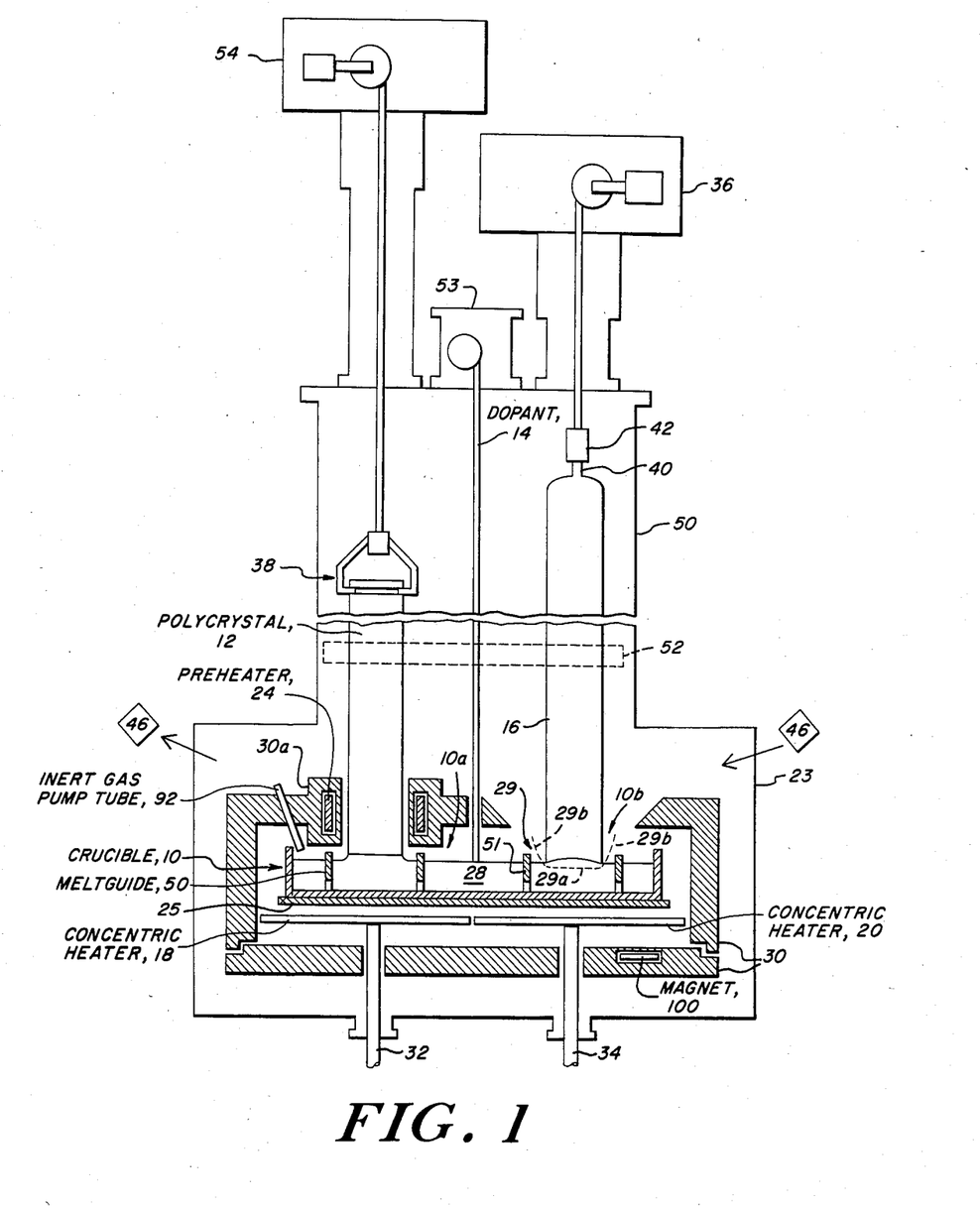
FIG. 1 is a schematic view in side elevation and partially in vertical section of a crystal growing system according to the present invention.
Figures 2, 3:
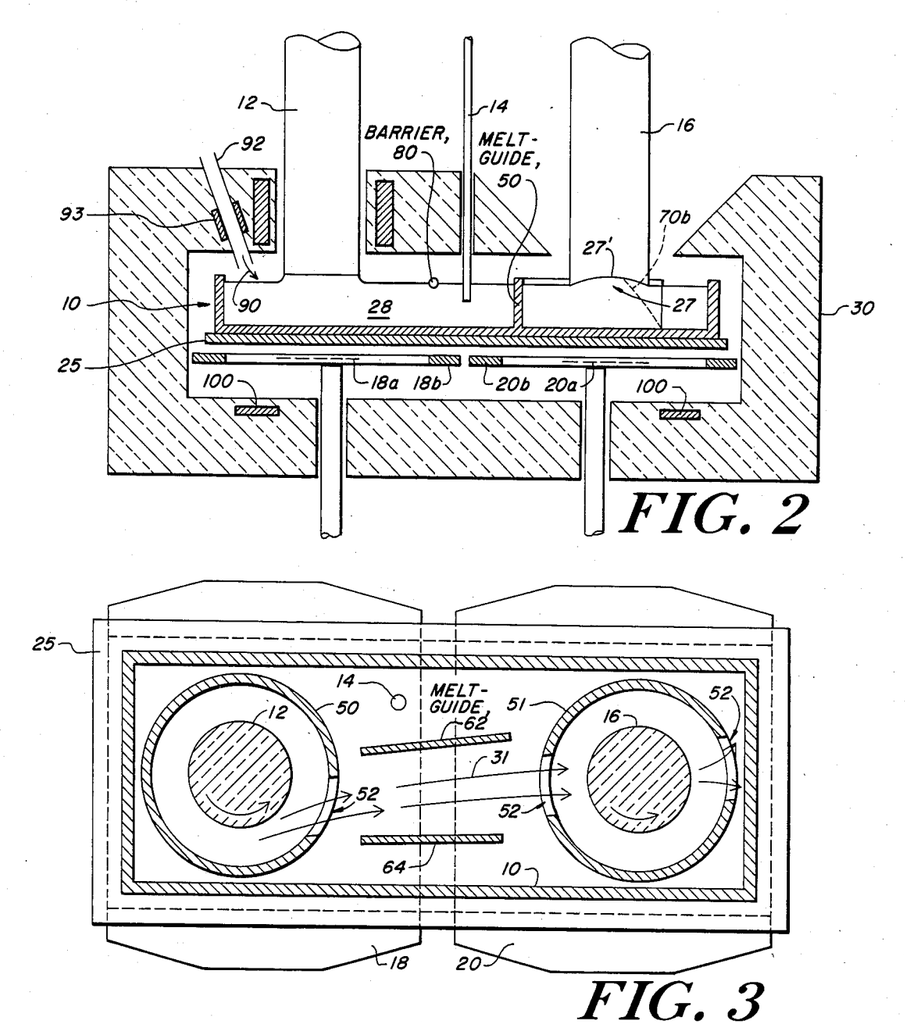
FIG. 2 is a detailed view of an alternative embodiment of this invention.
FIG. 3 is a top plan view of the crucible shown in FIG. 1.

A significant aspect of the present invention is that the crucible is heated through its bottom wall by several independent heaters, or groups of heaters, that are each associated with a separate zone of the crucible. As shown in FIGS. 1 and 3, there are two independent heaters, a main heater 18 positioned directly below a melt-in or replenishment zone 10a and another main heater 20 positioned directly below a crystal growth zone 10b. These heaters are preferably sheets of a thin, semi-flexible graphitic material that has a resistivity suitable for use as an electrical resistance heater. A suitable material is the product sold by Union Carbide under the trade designation Grafoil. One advantage of this material is that it can be cut into any desired shape, much like a piece of paper.

As shown in FIG. 1, the crucible 10 is located within a closed chamber 23 to provide a controlled atmosphere for the crystal growth. The chamber 23 can be maintained in an inert gas atmosphere or at a vacuum with an inert gas flow to sweep gases such as SiO from the crystal growing area. An insulation pack 30 generally surrounds the crucible, the main heaters and a crucible support 25 to conserve heat. While these elements are shown spaced apart in the drawings, in practice they are in close contact to minimize the thermal independence between the heaters and the melt.

To initiate a growth operation, a small charge of silicon is loaded into the crucible 10 and melted down under vacuum or an inert gas atmosphere using the main heaters 18 and 20. The heaters are connected to a power source by electrodes 32 and 34 that penetrate the insulation pack 30. In one form, best shown in FIG. 3, the heaters 18 and 20 have a generally rectangular shape and they are each substantially coextensive with the zones 10a and 10b when viewed in plan. In another embodiment, shown in FIG. 4, the main heaters are each multiple heaters, one being a small spiral shaped heater 18a, 20a located generally directly below and centered on the rod 12 and boule 16, respectively, and the other being a "picture frame" configured heater 18b, 20b or 18b', 20b' that generally surrounds the rod or boule when they are viewed in plan as shown.

The configuration of the heaters in combination with (1) their location adjacent to the crucible support plate with a short thermal path to the melt and (2) a short thermal path through the melt itself (resulting from the use of a shallow crucible and a shallow melt) allows a degree of control over the temperature profile within the melt that cannot be achieved using conventional CZ techniques. As will be understood by those skilled in the art, it is very important to have a well controlled, stable and properly configured thermal gradient in the melt, particularly at a growth zone 27 located in the melt immediately below the crystal 16 at the liquid-solid interface 27'. This is because the crystallization process is very temperature sensitive. Variations in temperature during growth, or spatial variations at any one moment of growth laterally across the growth zone, can produce non-uniformities in the structural and electrical properties of the crystal being grown. Ideally, at the growth zone the thermal profile should have a bowl shape as shown by the dotted line 29 in FIG. 1. The flat central portion 29a of this profile reflects a substantially constant steady state temperature near 1410° C., the temperature at which molten silicon will solidify, across the full lower surface area of the crystal being grown. The upturned edge portions 29b, 29b reflect an increase in temperature which limits the crystal growth radially. Using the present invention, it is possible to use this temperature profile as a principal mechanism for controlling the diameter of the crystal boule 16, whereas in prior art techniques the withdrawal rate has been the main control on crystal diameter. The hotter edge portions 29b, 29b, which in plan view are concentric with the boule 16, also have the advantage of maintaining the side walls of the crucible 10 at a sufficiently elevated temperature that they do not become cool enough to cause nucleation of the melt at the walls. This is, of course, important since this nucleation can eventually cause the single crystal boule to go polycrystalline.

The "picture frame" heaters 18b, 20b or 18b', 20b' are designed to produce the temperature profile exemplified by profile 29. This design is used both at the melt-in zone 10a and the crucible growth zone 10b to warm the side walls of the crucible without overheating them to a degree that will significantly enhance the dissolution of the crucible through the reaction $$SiO_2 + Si \rightarrow 2Si_{(l)} + 2O$$

where liquid silicon of the melt dissolves the silica crucible to produce oxygen in the melt. The control of this reaction is therefore crucial to controlling oxygen concentration in the crystal 161 this reaction is retarded by lowering the temperature of the walls and by reducing the flow rates of the liquid silicon against the silica walls of the crucible ("washing"). Therefore the heating of the walls to retard nucleation must be balanced against the desire to maintain the walls at the lowest possible temperature. The independent heater designs of the present invention, acting in combination with the short thermal paths provided by a shallow crucible, allow a realization of both of these conflicting objectives to a degree that has not been heretofore attained.

Another significant feature of the present invention is the use of multiple heating elements, e.g. 18a and 18b, in a single zone, 10a. In the melt-in zone 10a, the central spiral heater 18a is energized together with the "picture frame" heater 18b or 18b' to concentrate thermal energy dirctly below the rod 12 to facilitate its melting. In contrast, the spiral heater 20a is preferably energized only during start-up to assist bringing the melt to a uniform temperature sufficient to maintain it in a liquid state. However, when growth begins, the heater 20a is operated mainly in seeding and then preferably not operated to ensure that there is a radially uniform thermal profile across the growth zone, that is, the thermal profile line segment 29a should be substantially flat. As can be readily discerned from FIG. 4, the heaters 18b and 20b are generally rectangular and are positioned near the rectangular walls of the crucible. The heaters 18b' and 20b' are annular and concentric with the cylindrical feed rod 12 and crystal 16.

Another freature of the present invention is an auxiliary or pre-heater 24 that is mounted to surround the feed rod at a point closely spaced above the melt. As shown in FIG. 1, the pre-heater 24 is an electrical resistance heater mounted in a sleeve 30a of the insulation pack 30. The pre-heater heats the rod just before it reaches the melt to a temperature preferably about 100° C. lower than that of the liquid silicon in the melt, although pre-heating to temperatures of 800° to 900° C. has also proven to be effective. This pre-heating not only facilitates the melt-in of the rod, it also reduces disturbances in the thermal gradients within the melt caused by introducing a cooler solid body into the melt.

The polycrystalline silicon feed rod 12 is held at its upper end by a chuck 38. At the growth side of the apparatus, a single crystal seed 40 of the proper orientation is secured in a seed holder 42 of conventional design. Puller mechanisms 36 and 54, of conventional construction, raise, lower and rotate the crystal 16 and the feed rod 12, respectively. During start-up, once the proper operating atmosphere (usually a vacuum) is attained within the chamber, the feed rod is lowered by the mechanism 54 until is contacts and is slightly immersed in the melt. As noted above, the rod is preheated and then the main heater 18, or 18a, 18b or 18b', melts the immersed end of the feed rod.

The seed crystal 40 is contacted to the melt-in growth zone 10b and rotated at between 15 and 60 rpm. The temperature and pull rate are then adjusted to seed, shoulder, and produce a single crystal boule of silicon in a manner similar to that used in the conventional CZ process. The lowering of the feed rod is controlled manually or automatically by a standard melt level detector, for example, a laser melt level sensor, to maintain a constant, preselected melt depth. The diameter of the growing crystal 16 is controlled, as noted above, principally by the thermal profile at the growth zone 27, as opposed to the conventional technique of varying the pull speed. However, the puller 36 for the crystal 16 also raises the crystal 16 in response to a signal indicative of the diameter of the crystal using conventional sensory and control apparatus.

From the time the feed rod 12 is melted until the crystal 16 is tailed and withdrawn from the melt, there is no substantial change in the composition of the melt. As a result, the final pr.douct is generally uniform in dopant and oxygen concentration. Even the thermal radiation field is constant except for the impact of the length of growing crystal 16 above the growth interface 27'. After growth, the crystal and the feed rod are withdrawn into the crystal housing 50, the valve 52 closed, the crystal 16 removed, and another feed rod 12 loaded into the system. In approximately an hour or less another crystal can be started growing. The same crucible can be reused since there is a low level of dissolution and a low level of impurity build up since the feed material is a highly pure grade of polycrystalline silicon which has extremely low levels of impurities.

A principal feature of the present invention is the use of mechanical pumping to produce a three dimensional flow 31 field within the melt that is controlled and directed. Three dimensional means that the flow field extends laterally and vertically within the melt. Controlled and directed mean that the flow has a direction, as is normally characterized by the generally parallel flow lines of a laminar fluid flow. However, for the purposes of this discussion, a controlled and directed flow can he what is generally termed transitional, or even turbulent, provided that it has an overall flow direction. The flow of the present invention is in sharp contrast with turbulent stirring where the flow is disorganized and complex.

While magnetic pumping and siphon,ing are known to transport molten silicon, hereto-fore there has been no system for mechanical pumping. Major drawbacks are that most structures placed in the melt will ordinarily melt or dissolve and even if they do not melt, they will contaminate the liquid silicon. In one embodiment, the feed rod 12 is rotated by the puller mechanism 54 so that the lower end of the rod immersed in the melt pumps the melt in a generally circular movement about the feed rod. There is no contamination problem because the feed rod is highly pure and it is the very material that needs to be added to replenish the melt. For a feed rod having a diameter of about 6 cm, a rotation rate of 15 to 40 rpm, has been found to produce the desired pumping action within the melt. A second approach, illustrated in FIG. 2, utilizes a strong directed flow 90 of an inert gas, preferably argon, directed through a quartz tube 92, to impact on the surface of the melt and drive the impacted portion in the direction selected for the controlled, directed flow.

Another principal feature of the present invention, and one closely related to the mechanical pumping, is the use of quartz guide elements positioned within the crucible 10 to direct the pumped flow from the replenishment zone 10a to the growth zone 10b, with the flow sweeping through the growth interface 27 under the crystal 16. This sweeping is important to produce a thin boundary layer, supply a melt with the desired dopant level, and remove impurities that would otherwise build up at the growth interface 27.

FIGS. 1—3 illustrate one arrangement for such guide elements utilizing a pair of circular quartz collar rings 50, 51 secured to the bottom wall of the crucible and positioned concentrically about the feed rod and the crystal 16, respectively. The rings preferably do not extend above the surface of the melt so that they do not radiate heat into the chamber 23 that they conduct from the bottom wall of the crucible adjacent the heaters. Each ring includes at least one port 52 located below the surface of the melt. The ring 50 surrounding the feed rod has one port positioned so that the pumped melt swirling about the feed rod exits the ring as the controlled, directed flow 31 aimed at the growth interface 27. The ring 51, in turn, has at least two ports 52 aligned with the flow 31 exiting the ring 50 that allow it to sweep through the growth interface 27 in a generally straight line path. The circular geometry of the ring 51 is also significant in creating a radially symmetric thermal environment as "seen" by the growing crystal 16. To further direct the flow, guide walls 62, 64, also formed of quartz, channel the flow from the ring 50 to the ring 51.

Figure 4:
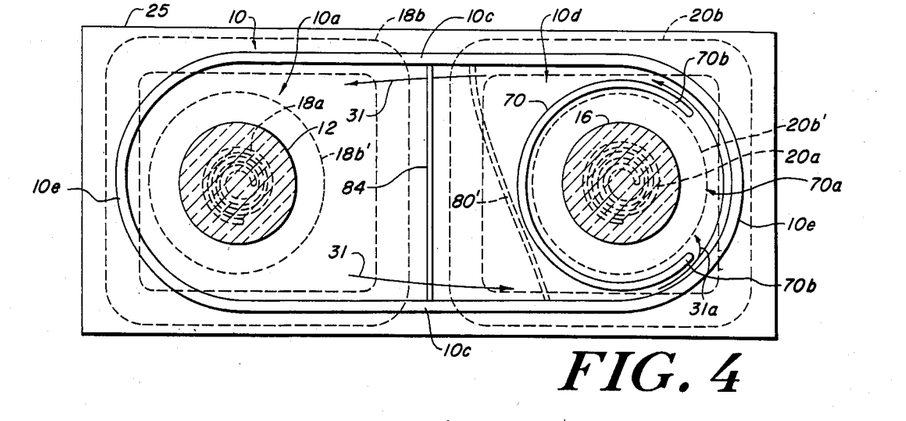
FIG. 4 is a top plan view of the crucible design shown in FIG. 2.

In another form shown in FIG. 4, the guide elements is one generally "C" shaped ring 70 that is preferably positioned to be concentric with the crystal 16 and with the opening 70a in the collar facing away from the feed rod. With this arrangement, the pumped flow 31 proceeds along one side wall 10c of the crucible, flows between the ring 70 and that wall and a curved end wall 10d. A portion 31a of the flow, preferably about 10%, enters the ring 70 with the remaining portion of the flow continuing around the crucible to the replenishment zone 10a. It is believed that the flow portion entering the ring 70 acts as though it were in a centrifugal pump. The three dimensional portion of the flow that enters the collar 70 is believed to lie closer to the bottom wall of the crucible 10 than the surface of the melt. Once in the ring 70, it flows upwardly and exits the opening 70a near the surface of the melt after having swept through the growth interface 27 as a directed flow that achieves the objectives of a pumped flow noted above. To facilitate the entrance and exit of a portion of the flow 31 from the ring 70, the edges 70b of the collar adjacent the opening 70a are tapered downward towards the opening. The movement of the melt through the growth region is also facilitated by rotating the crystal 16 as it grows in the same direction as the flow portion moving through the ring 70.

With this preferred pump embodiment, the crucible 10 preferably has a race-track shaped configuration in plan view as shown in FIG. 4. The side walls 10c, 10d are straight and parallel, and the end walls 10e, 10e are smoothly curved, and preferably are arcs of a circle. This crucible design functions in cooperation with the pumping action of the feed rod and the C-shaped ring 70 to direct the flow 31 from the replenishment zone, circling around the ring, with the main portion of the flow returning to the replenishment zone. This curved end configuration also avoids the development of eddy currents in the corners of the crucible which would occur with the same general flow pattern in a rectangular crucible.

The mechanical pumping and directed flow should be sufficiently strong to produce the operational characteristics listed above, as evidenced by a grown crystal that has an excellent crystal structure and extraordinary uniformity, both axially and radially, in its oxygen and dopant concentrations. Variations in the range of 1–3% are typical. However, it is important to balance these objectives against a desire to avoid a flow that strongly washes any silica components of the crucible, including guide elements and side walls, which will accelerate their deterioration and place additional oxygen in solution in the melt. Again, the measured oxygen concentration levels in the crystal 16 are the ultimate criteria in determining oxygen control, both through a reduction in washing and through operation in such a manner that silica surfaces wetted by the melt are maintained at the lowest possible temperature without creating other problems such as nucleation and SiO gas condensation on the melt.

While the shallow crucible and shallow melt greatly inhibit the formation of convection cells, particularly as compared to conventional CZ processes, they will occur to some extent whenever there are temperature differences within the melt. Another advantage of the pumped flow 31 of the present invention is that to the extent convection cells are present, particularly at or near the growth zone, the flow 31 may override the convective flow so that the crystal growth is not influenced by the convective flows.

While the foregoing discussion has focused on pumping by rotating the feed rod, the inert gas flow arrangement noted briefly above is also a possible approach. Because the gas is inert, it does not react chemically with the melt. Because the flow is strong enough to create the flow 31, it can be a source of disturbance to the thermal balance of the growth process. The gas is therefore preferably heated to a temperature near that of the melt before it is applied to the quartz tube 92. Note that there will be some cooling of the gas as it exits the tube and expands. To offset this and other cooling related problems associated with a "cold" mass near the melt, the quartz tube itself should be heated. One arrangement is to apply an electrical resistance heater 93 directly to the tube. A simpler approach, and one which avoids the possibility of carbon contamination from a heater, is to position the quartz tube close to the melt 28 so that the heat radiated from the melt will heat the tube. While this radiation will cause a cooling of the melt, the position is preferably over or near the main heater 18 or 18b so that heat transport within the melt from the heater quickly distributes the heat to avoid problems associated with a strong localized cooling.

Another feature of the present invention is a silica barrier 80 that controls the movement of floating particulates that collects on the surface of the melt. Oxygen in solution in the melt from the reaction of the liquid silicon with the silica crucible evaporates into the atmosphere over the melt as SiO gas. Preferably there is a slight downflow of argon or another inert gas that sweeps the SiO out of the system. However, some SiO gas will condense on the surface of the feed rod and thus be fed into the melt. The particulates are drawn by the surface tension driven flow of the melt toward the growing single crystal or other cooler areas of the melt. This remains a problem since if the particulates reach the single crystal 16 it can contaminate it or cause it to become polycrystalline.

The barrier 80 extends across the crucible 10 from one side wall 10c to the opposite side wall 10d, to separate the melt in one from the growth zone. The lower surface of the barrier is in contact with, or partially immersed in the melt to block the movement of the scum to the crystal 16 in response to the surface tension forces. The barrier may be positioned to separate the crucible surface in the zone 10a from that in the zone 10b as by a straight barrier extending directly across the crucible with one end fused to a wall 10c or 10d. This isolates floating particulates forming in the melt-in zone from the growth zone. It also isolates the particles which collect on the outer surface of the feed rod to form an oxide film which is then melted into the liquid silicon along with the polycrystalline feed rod. In a preferred form the barrier is located closer to the growth zone, as with the slanted configuration 80' shown in phantom in FIG. 4 to expand the melt surface area that is available for the collection of particulates but which is blocked from reaching the growth zone. Of course, the barrier 80 can be formed by multiple elements, or by allowing one or both of the rings 50, 51 or 70, to project slightly above the melt surface to act as a barrier. This arrangement, however, has a significant drawback as compared to the barrier 80 in that heat is conducted by the rings from the bottom wall of the crucible near the heaters to the space above the melt where it can be radiated. Besides being thermally inefficient, this arrangement can also create undesired perturbations in the temperature profile within the melt.

Carbon is present in small quantities in both the feed silicon 12 and the grown crystal 16. The level must be kept below 45 ppm in the melt 28 or small SiC crystals will form causing the crystal 16 to become polycrystalline. In the conventional CZ process, the source of carbon in the melt is the graphite heating element, insulation pack, and crucible holder. In one chemical pathway, SiO is evolved from the melt 28 and reacts with the carbon from the graphite parts to produce SiC ahd CO. The CO is then transported by diffusion or convection back to the melt where it reacts with the silicon in solution. The second chemical pathway involves the reaction between the fused silica crucible and the graphite, $SiO_2 + 3C \rightarrow SiC + 2CO$. In both cases, the CO must get back to the melt in order for the extra carbon to build up in the melt. In the conventional CZ system, a forced argon flow is brought down from the top of the crucible housing, swept along the crystal and over the melt, and then withdrawn from below the hot zone. In this way, the flowing gas moves away from the crucible towards the graphite parts, forming a barrier to the transport of CO back to the melt. This argon flow creates substantial convective flows through the chamber. As the melt lowers in the crucible, a convective cavity forms under the growing crystal.

In the present system, graphite parts which directly face the silicon in the hot zones are coated with silicon carbide. The SiO reacts with the graphite but does not react with the SiC. Any other parts in contact with the hot $SiO_2$, such as the crucible support plates 25 may also be coated with SiC. The problem of graphite fines reaching the melt is further prevented by insuring the top insulation pack 30 is closed around the melt. The butted surfaces of the insulation pack 30 are also coated with silicon carbide to make them less likely to powder. A high velocity argon gas flow from the top of the crucible along the crystal and over the melt is also used to sweep out any graphite fines. Due to the shallow melt level and the slight extension of the crucible above the melt, smaller convective pockets are formed in the crucible.

Other impurities in the crystal 16 are derived mainly from the feed source 12, the crucible 10, and by the handling conditions. To minimize these impurities, the source material 12 should be carefully selected. Crucibles may be loaded in clean room conditions. The crucible 10 may be made of either fused quartz or fused silica which is produced from $SiH_4$ which is much purer than the standard fused silica. Since the crucible in the present system is very shallow, the problem of slumping of the fused silica at the higher temperatures used in the standard CZ process is avoided.

The source of material is preferably a high grade polycrystalline silicon. Although the invention is described with reference to the crystallization of very pure silicon, any other compound which forms crystals may be used in the present system. In particular, germanium and other elemental semiconductors found in Group 4A of the Periodic Table or Group 3A–5A compounds formed from such elements as indium, arsenic, antimony and gallium.

Uniformity of the dopant distribution within the crystal 16, both axially and radially, is produced in part by the features of this invention discussed above: crucible design, heating, mechanical pumping and a controlled, guided flow of melt through the growth zone. Dopant distribution is also controlled by the dopant feed mechanism 53 that lowers a rod of a dopant material 14 into the melt where it liquifies and mixes with the liquid silicon. The rate at which the dopant is added is generally equal to the rate at which the dopant is incorporated into the crystal 16 and thereby removed from the melt. It should be noted that the dopant is not like the impurities introduced by the feed material where the impurities are steadily rejected from the as grown crystal and therefore build up in the melt. Rather, the dopant is purposely added and incorporated into the crystal at a known rate. The dopant level can therefore be controlled, and controlled independently of other growth parameters. Note that this significant advantage derives in part from the fact that the temperature gradient at the growth interface 27 is unusually constant and well defined as compared to prior art CZ processes. The absence of strong convection cells such as would normally produce swirls is also an important aspect of the present system that provides the extraordinary dopant level control and distribution uniformity. Still another interrelated aspect of the present invention is that the flow 31 mixes the dopant with the liquid silicon before it reaches the growth zone so that the melt sweeping under the solid-liquid growth interface at the bottom of the crystal 16 itself has a generally spatially uniform distribution of the dopant.

As noted above, the oxygen level in the crystal 16 is maintained at a constant value by controlling the reaction of the liquid silicon with the silica crucible components and by holding the melt level constant throughout the growth process. An automatic melt level detector 46 and the other conventional control elements control the lowering of the feed rod 12 and therefore the volume of the melt. An oxygen level in the range of 5-15 ppm is desirable for many semiconductor applications. The present invention allows the crystal 16 to be grown not only with a spatially uniform oxygen distribution within the crystal lattice, but also a preselected value, even a very low one, e.g., in the range of 5-10 ppm. In the present system, the ratio of silicon wetted wall area to silicon gas interface is maintained at about 1.1 to 1.2:1 during the entire crystal growth period. This is in contrast to the conventional CZ process in which the ratio of silicon wetted wall area to silicon gas interface begins at 3-5:1 and continuously decreases as the melt level drops to a minimum of about 1.1:1, thereby producing variation in oxygen content.

Using the shallow melt system with a constant melt level, convection in the melt under the rotated, growing crystal 16 is greatly decreased. Even in the area directly under the rotating crystal 16, the flow is controlled and directed rather than turbulent. By using a mechanical means for directing and controlling the flow, the distribution of dopants and impurities is made more uniform.

Another feature of the present invention is the use of small permanent magnets 100, 100 located near the melt, preferably under the bottom wall of the crucible, to produce a magnetic field within the melt that is sufficient to damp convective flows within the melt. In the prior art, massive supercooled magnets with large power consumption were required to damp the movement of the melt. Because of the shallow crucible geometry of this invention, it is possible to achieve the same advantages using only small permanent magnets, for example, ones formed from Alnico.

While this invention has been described with reference to its preferred embodiments, other modifications and variations will occur to those skilled in the art from the foregoing detailed description and the accompanying drawings. For example, while the invention has been described with reference to rectangular and oval crucibles, it is possible to use a circular crucible with the crystal 16 from an interior region and replenishment accomplished by adding powder or chunk polycrystalline silicon into the region between the crystal and the side wall of the crucible. Another variation can include different heater configurations including heaters external to the crucible that heat through the side walls of the shallow crucible as well as the bottom wall. It is also possible to grow simultaneously from more than one growth zone, or to have multiple replenishment zones. It is also possible to use a non-cylindrical feed "rod". These and other modifications are intended to fall within the scope of the appended claims.

What is claimed is:

1. A process for growing single crystal material comprising:
   providing a quantity of a melt of feed material from which a single crystal is grown in a non-rotating pool that is sufficiently shallow to avoid the formation of substantial convection cells within said melt, said melt having a replenishment zone wherein crystal-forming feed material is added to the melt and at least one growth zone laterally displaced from the replenishment zone;
   feeding solid material for growing a single crystal into the replenishment zone;
   melting the solid material;
   inducing a controlled, directed flow of the melted feed material from the replenishment zone to the growth zone;
   providing internal guide members within the melt for guiding the melted feed material from the replenishment zone to the growth zone;
   seeding, shouldering, and pulling a single crystal from the growth zone;
   wherein the melted feed material flow is cooperatively induced and guided so that at least a portion of the directed flow passes under the growing single crystal to produce a thin boundary layer containing a uniform distribution of impurities with no substantial disturbance of thermal gradients in the growth zone.

2. The process of claim 1 further comprising restricting the movement of contaminants on the surface of the melt from the replenishment zone into the growth zone.

3. The process of claim 1 further comprising positioning a circular baffle in the melt at the growth zone with an opening aligned to receive said directed flow to establish a generally cylindrical, non-rotating thermal environment in the immediate vicinity of said single crystal and generally concentric with it.

4. The process of claim 3 wherein said providing of guide members includes positioning guide means in the replenishment zone generally concentric to the solid material, said guide means having an opening aligned to guide said flow to said growth zone.

5. The process of claim 1 wherein said inducing comprises providing a rod-shaped length of feed material of substantial initial length;
   contacting the solid rod-shaped length of feed material to the surface of the melted material; and
   rotating the rod-shaped length.

6. The process of claim 5 further comprising preheating the rod-shaped length of solid feed material above the melt.

7. The process of claim 5 wherein said rotation is sufficiently fast to produce said directed flow and said thin boundary layer at said growth zone but is sufficiently slow to minimime the washing of the crucible walls.

8. The process of claim 1 wherein said inducing comprises injecting an inert gas flow onto the surface of the melted material in the replenishment zone to move the melted material to the growth zone in said directed, controlled flow.

9. The process of claim 8 wherein the inert gas is argon.

10. The process of claim 1 further comprising the steps of independently heating the replenishment zone and the growth zone and controlling said heating to produce a highly uniform, steady state thermal gradient in the melt in the growth zone.

11. The process of claim 10 wherein said heating at the replenishment zone and the growth zone occurs directly under the solid material and the single crystal, respectively.

12. The process of claim 10 wherein said heating includes auxiliary independent heating of the replenishment zone and the growth zone.

13. The process of claim 12 wherein said independent auxiliary heating comprises heating the outer periphery of the growth zone and the replenishment zone independently.

14. The process of claim 1 further comprising adding a dopant to the replenishment zone.

15. The process of claim 14 wherein the dopant is added as a solid length of material at the same rate at which the dopant is withdrawn in the growing crystal.

16. The process of claim 14 wherein the dopant is coated onto the feed material wherein an amount is introduced into the melt at the same rate at which the dopant is withdrawn is the growing crystal.

17. The process of claim 1 further comprising the step of magnetically controlling the viscosity of the melt.

18. The process of claim 1 wherein said feed material is selected from the group consisting of silicon and germanium.

* * * * *